United States Patent
Kim

(10) Patent No.: US 7,088,152 B2
(45) Date of Patent: Aug. 8, 2006

(54) DATA DRIVING CIRCUIT AND SEMICONDUCTOR MEMORY DEVICE HAVING THE SAME

(75) Inventor: Jin-Hyun Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 57 days.

(21) Appl. No.: 10/848,913

(22) Filed: May 18, 2004

(65) Prior Publication Data
US 2005/0046472 A1 Mar. 3, 2005

(30) Foreign Application Priority Data
Aug. 26, 2003 (KR) ............... 10-2003-0059298

(51) Int. Cl.
*H03B 1/00* (2006.01)
(52) U.S. Cl. ...................... 327/108; 327/563
(58) Field of Classification Search .......... 327/562, 327/563, 108
See application file for complete search history.

(56) References Cited
U.S. PATENT DOCUMENTS

| | | | | |
|---|---|---|---|---|
| 5,903,513 A | * | 5/1999 | Itou | .................... 365/233 |
| 6,057,716 A | * | 5/2000 | Dinteman et al. | .......... 327/108 |
| 6,522,174 B1 | * | 2/2003 | Martin et al. | ............... 326/115 |
| 6,922,091 B1 | * | 7/2005 | Kizer | .................... 327/156 |
| 2002/0171453 A1 | * | 11/2002 | Kanamori et al. | ............ 327/57 |

* cited by examiner

*Primary Examiner*—My-Trang Nuton
(74) *Attorney, Agent, or Firm*—Marger Johnson & McCollom, P.C.

(57) ABSTRACT

A data driving circuit includes a driver in which a driving current is controlled in response to predetermined bits of digital control signal and which receives a differential input data signal to generate differential output data signal; and a digital control signal generator for storing and generating the digital control signal. The driver includes a pre-driver for passing a pre driving current in response to a bias voltage and for receiving the differential input data signal(s) to generate first and second signals; and a main driver in which a main driving current is controlled in response to the digital control signal and which generates the differential output data signals in response to the first and second signals. The data driving circuit can not only vary an amplitude and a level but also shift a level, and by varying a current of the current sources in response to the digital control signal, a margin is secured in a saturation region of transistors which constitute the current sources, thereby generating a stable differential output data signals insensitive to a noise.

24 Claims, 9 Drawing Sheets

DATA DRIVING CIRCUIT AND SEMICONDUCTOR MEMORY DEVICE HAVING THE SAME

CROSS-REFERENCE TO RELATED APPLICATION

This application claims the benefit of Korean Patent Application No. 2003-59298, filed Aug. 26, 2003, the disclosure of which is hereby incorporated herein by reference in its entirety.

BACKGROUND OF THE INVENTION

1. Field of the Invention

The present invention relates to a data driving circuit and, more particularly, to a data driving circuit and a semiconductor memory device having the same which can generate a signal of various levels and amplitudes.

2. Description of the Related Art

A conventional data driving circuit includes a bias voltage generator which generates a bias voltage and a driver which receives a differential data signal to generate a differential output data signal. The driver includes a pre-driver and a main driver. The pre-driver and the main driver receive a differential input data signal and generate a differential output data signal by a current controlled by a bias voltage.

However, the conventional data driving circuit has a problem in that it is impossible to generate a differential output data signal having various levels and amplitudes desired at a receiving side.

FIG. 1 is a circuit diagram illustrating a conventional data driving circuit. The data driving circuit of FIG. 1 includes a main driver 10, pre-drivers 12-1 and 12-2, and a bias voltage generator 14. The main driver 10 includes resistors R1 and R2, NMOS transistors N1 and N2, and a current source I1. The pre-driver 12-1 includes a resistor R3, an NMOS transistor N3, and a current source I2, and the pre-driver 12-2 includes a resistor R4, an NMOS transistor N4, and a current source I3.

Operation of the data driving circuit of FIG. 1 is explained below.

The bias voltage generator 14 receives a bias voltage Vb to generate a bias voltage TVb. The current sources I1 to I3 are controlled by the bias voltage TVb to pass a constant current. The NMOS transistor N3 is turned on or off in response to an input data signal di, and the NMOS transistor N4 is turned on or off in response to an inverted input data signal diB. The pre-drivers 12-1 and 12-2 lower a voltage of a node a and raise a voltage of a node b when the differential input data signals di and diB have "high" and "low" levels, respectively. That is, at node a is a voltage generated by the resistor R3 and the current source I2 is subtracted from a voltage VDDQ, and at node b is a voltage VDDQ. On the other hand, when the differential input data signals di and diB are "low" level and "high" levels respectively, the pre-drivers 12-1 and 12-2 generate a voltage VDDQ at the node a and a voltage generated by the resistor R4 and the current source I3 is subtracted from a voltage VDDQ at the node b. The NMOS transistors N1 and N2 control a current flowing therethrough in response to voltages of the nodes a and b, respectively. That is, the main driver 10 generates differential output data signals do and doB of "high" level and "low" levels when node a is lower in voltage than node b, whereas the main driver 10 generates differential output data signals do and doB of "low" level and "high" levels when node b is lower in voltage than node a.

FIG. 2 is a detailed circuit diagram illustrating the data driving circuit of FIG. 1. The bias voltage generator 14 includes a resistor R5, NMOS transistors N9 and N10, and a comparator COM. The current source I1 includes NMOS transistors N5 and N6. The current source I2 includes an NMOS transistor N7. The current source I3 includes an NMOS transistor N8.

The NMOS transistors N7 and N8 are designed to be much wider in channel width than the NMOS transistors N5 and N6.

Operation of the data driving circuit of FIG. 2 is explained below.

The bias voltage generator 14 generates a constant bias voltage TVb such that it lowers bias voltage TVb when a voltage of a node c is higher than a bias voltage Vb and raises bias voltage TVb when the voltage of node c is lower than bias voltage Vb. The NMOS transistors N5 to N8 pass a constant current in response to bias voltage TVb. When bias voltage TVb is raised, an amount of a current passing through the NMOS transistors N5 to N8 is increased, whereas when bias voltage TVb is lowered, an amount of a current passing through the NMOS transistors N5 to N8 is decreased. When an amount of a current passing through the NMOS transistors N5 to N8 is increased, in response to the differential input data signals di and diB of "high" and "low" levels, the NMOS transistor N3 is turned on, and the NMOS transistor N4 is turned off. In this case, the voltage of node a becomes lower than it was before the bias voltage TVb was raised, and the voltage of node b becomes equal to what it was before bias voltage TVb was raised. Therefore, a resistance through the NMOS transistor N1 becomes greater than it was before bias voltage TVb was raised, and a resistance through the NMOS transistor N2 becomes equal to what it was before bias voltage TVb was raised. Consequently, a current flowing through the resistor R2 and the NMOS transistor N2 is increases more than a current flowing through the resistor R1 and the NMOS transistor N1. An output data signal do of a "high" level which is almost equal to what it was before a bias voltage TVb is raised and an output data doB which is lower than before a bias voltage TVb is raised are generated. On the other hand, when the differential input data signals di and diB of "low" and "high" levels are inputted, a level of the differential output data signals do and doB of "low" and "high" levels are generated. The differential output data signal do of a "low" level becomes lower than it was before a bias voltage TVb was raised. That is, as bias voltage TVb is raised, the differential output data signal of a "low" level becomes gradually lower, and thus an amplitude of the differential output data signals do and doB becomes gradually greater.

The conventional data driving circuit described above controls a current flowing through the main driver 10 and the pre-drivers 12-1 and 12-2 by the bias voltage TVb, thereby varying an amplitude and a level of the differential output data signals do and doB.

However, the conventional data driving circuit can vary an amplitude and a level of the differential output data signal by raising a bias voltage TVb but cannot shift a level.

Also, the conventional data driving circuit has a problem in that an increase of level of bias voltage TVb decreases a margin in saturation region of the NMOS transistors N5 to N8 of the pre-drivers 12-1 and 12-2 and the main driver 10, whereby the differential output data signals do and doB are sensitive to a noise.

SUMMARY OF THE INVENTION

It is an object of the present invention to provide a data driving circuit which can vary an amplitude and a level of differential output data signal, shift a level of the differential output data signals, and generate stable differential output data signals which are not sensitive to noise.

It is another object of the present invention to provide a semiconductor memory device having a data driving circuit for achieving the foregoing object.

In order to achieve the objects, the present invention provides a first aspect of a data driving circuit, comprising: a driver in which a driving current is controlled in response to predetermined bits of digital control signal and which receives a differential input data signal to generate a differential output data signal; and a digital control signal generator for storing and generating the digital control signal.

The driver includes a pre-driver for passing a pre-driving current in response to a bias voltage and for receiving the differential input data signals to generate first and second signals; and a main driver in which a main driving current is controlled in response to the digital control signal and which generates the differential output data signals in response to the first and second signals.

The driver includes a pre-driver in which a pre-driving current is controlled in response to one part of predetermined bits of the digital control signal and which receives the differential input data to generate first and second signals; and a main driver in which a main driving current is controlled in response to other part of predetermined bits of the digital control signal and which generates the differential output data signals in response to the first and second signals.

The pre-driver includes a first pre driving circuit having a first load connected between a power voltage and a first node, a first switching transistor for being connected to the first node and for being switched in response to an input of the differential input data signals, and a first pre driving current source connected between the first switching transistor and a ground voltage and passing the pre driving current in response to the bias voltage (one part of predetermined bits of the digital control signal), wherein the first pre driving circuit generates the first signal through the first node; and a second pre driving circuit having a second load connected between a power voltage and a first node, a second switching transistor transistor connected to the second node and switched in response to an inverted input data signal of the differential input data signals, and a second pre driving current source connected between the second switching transistor and a ground voltage and passing the pre driving current in response to the bias voltage (one part of predetermined bits of the digital control signal), wherein the second pre driving circuit generates the second signal through the second node.

The main driver includes a third load connected between a power voltage and a third node; a fourth load connected between a power voltage and a fourth node; a first transistor connected between the third node and a fifth node and having a gate receiving the first signal; a second transistor connected between the fourth node and the fifth node and having a gate receiving the second signal; and a main driving current source connected in parallel between the fifth node and the ground voltage and which a main driving current is controlled in response to the digital control signal (other part of the predetermined bits of the digital control signal), wherein a non-inverted data signal of the differential output data signals is generated through the third node and an inverted output data signal of the differential output data signals is generated through the fourth node.

The present invention further provides a second aspect of a data driving circuit, comprising: a bias current generating circuit for generating a bias current in response to predetermined bits of digital control signal; and a driver for mirroring the bias current to generate a driving current and receiving a differential input data signal to generate a differential output data signal.

The bias current generating circuit includes a digital control signal generating circuit for storing and generating the digital control signal; a first load connected between a power voltage and a first node; a predetermined number of first transistors connected between the first node and a second node, respectively having gates receiving the predetermined bit of digital control signal and generating the bias current; a comparator comparing a voltage of the first node to a predetermined voltage to generate an output voltage to the second node; and a second transistor connected between the second node and a ground voltage, having a gate connected to the second node and passing the bias current.

The driver includes a pre-driver for mirroring the bias current to pass a pre driving current and for receiving the differential input data signals to generate first and second signals; and a main driver for mirroring the bias current to pass a main driving current and receiving the first and second signals to generate the differential output data signals.

The driver includes a pre-driver for passing a pre driving current in response to a bias voltage and for receiving the differential input data signals to generate first and second signals; and a main driver for mirroring the bias current to pass a main driving current and receiving the first and second signals to generate the differential output data signals.

The present invention further provides a first aspect of a semiconductor device having a plurality of data driving circuits, comprising: each of the plurality of the data driving circuit includes a driver in which a driving current is controlled in response to predetermined bits of digital control signal and which receives a differential input data signal to generate a differential output data signal; and a digital control signal generator for storing and generating the digital control signal.

The present invention further provides a second aspect of a semiconductor device having a plurality of data driving circuits, comprising: each of the plurality of the data driving circuit includes a bias current generating circuit for generating a bias current in response to predetermined bits of digital control signal; and a driver for mirroring the bias current to generate a driving current and receiving a differential input data signal to generate a differential output data signal.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
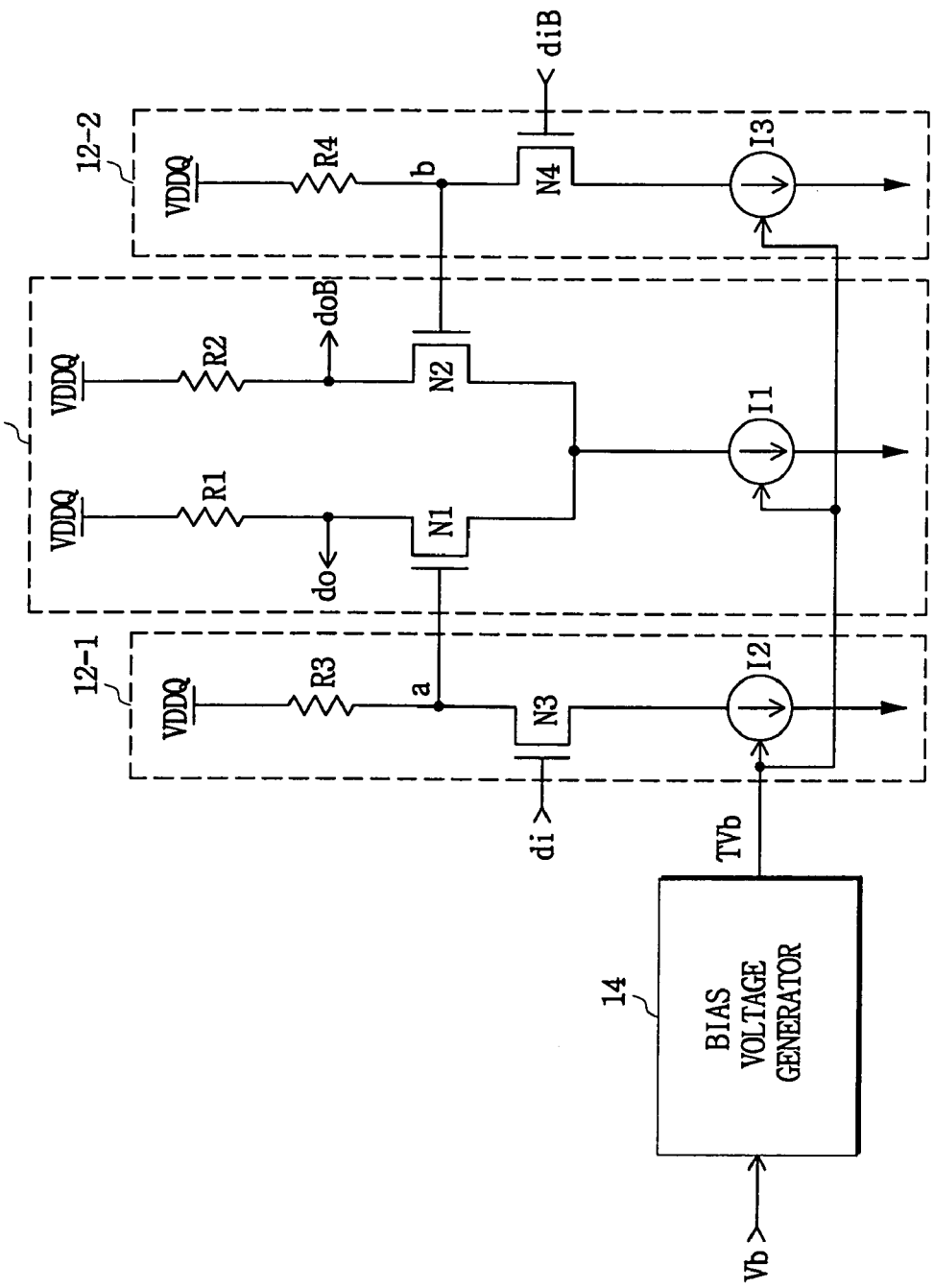
FIG. 1 is a circuit diagram illustrating a conventional data driving circuit.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, dimensional features may be exaggerated for clarity. Like numbers refer to like elements throughout the specification.

Figure 3:
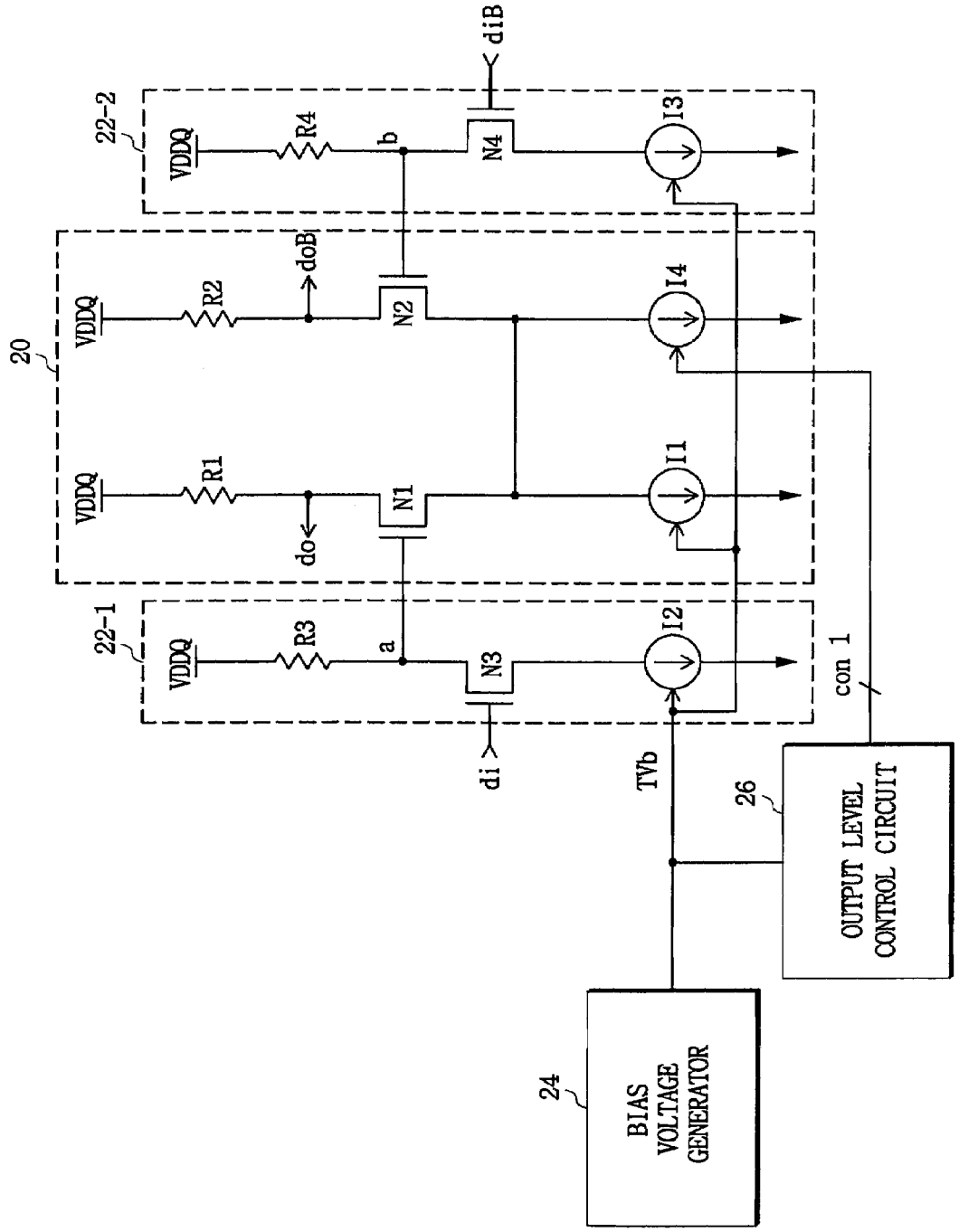
FIG. 3 is a circuit diagram illustrating a data driving circuit according to a first embodiment of the present invention.

FIG. 3 is a circuit diagram illustrating a data driving circuit according to a first embodiment of the present invention. The data driving circuit of FIG. 3 includes a main driver 20, pre-drivers 22-1 and 22-2, a bias voltage generating circuit 24, and an output level control circuit 26.

In FIG. 3, the pre-drivers 22-1 and 22-2 are the same as those of FIG. 1, and the main driver 20 is one in which a current source I4 is added in parallel to current source I1 in the configuration of the main driver 10 of FIG. 1. Current source I4 is controlled by the output level control circuit 26 as next described.

Operation of the data driving circuit of FIG. 3 is explained below.

The bias voltage generating circuit 24 generates a constant bias voltage TVb. The current sources I1 to I3 each control a current in response to a bias voltage TVb. The output level control circuit 26 uses bias voltage TVb as a power voltage to generate predetermined bits of digital control signal con1 to current source I4. The current source I4 controls a current in response to predetermined bits of digital control signal con1 outputted from the output level control circuit 26. The main driver 20 generates differential output data do and doB of "high" and "low" levels when node a in pre-driver 22-1 is lower in voltage than node b in pre-driver 22-2 and generates differential output data signal do and doB of "low" and "high" levels when a node a is higher in voltage than a node b, which is the same operation as in the data driving circuit of FIG. 1. The main driver 20 varies a level of the differential output data signal do and doB when a current is increased by the current source 14. That is, as current of the current source I4 is increased, the differential output data signals do and doB have an amplitude that is equal but a level which is shifted.

The data driving circuit of FIG. 3 does not vary a current of the current source I4 by varying a bias voltage but shifts a level of the differential output data signal do and doB by varying a digital value of predetermined bits of digital control signal con1.

Figure 4:
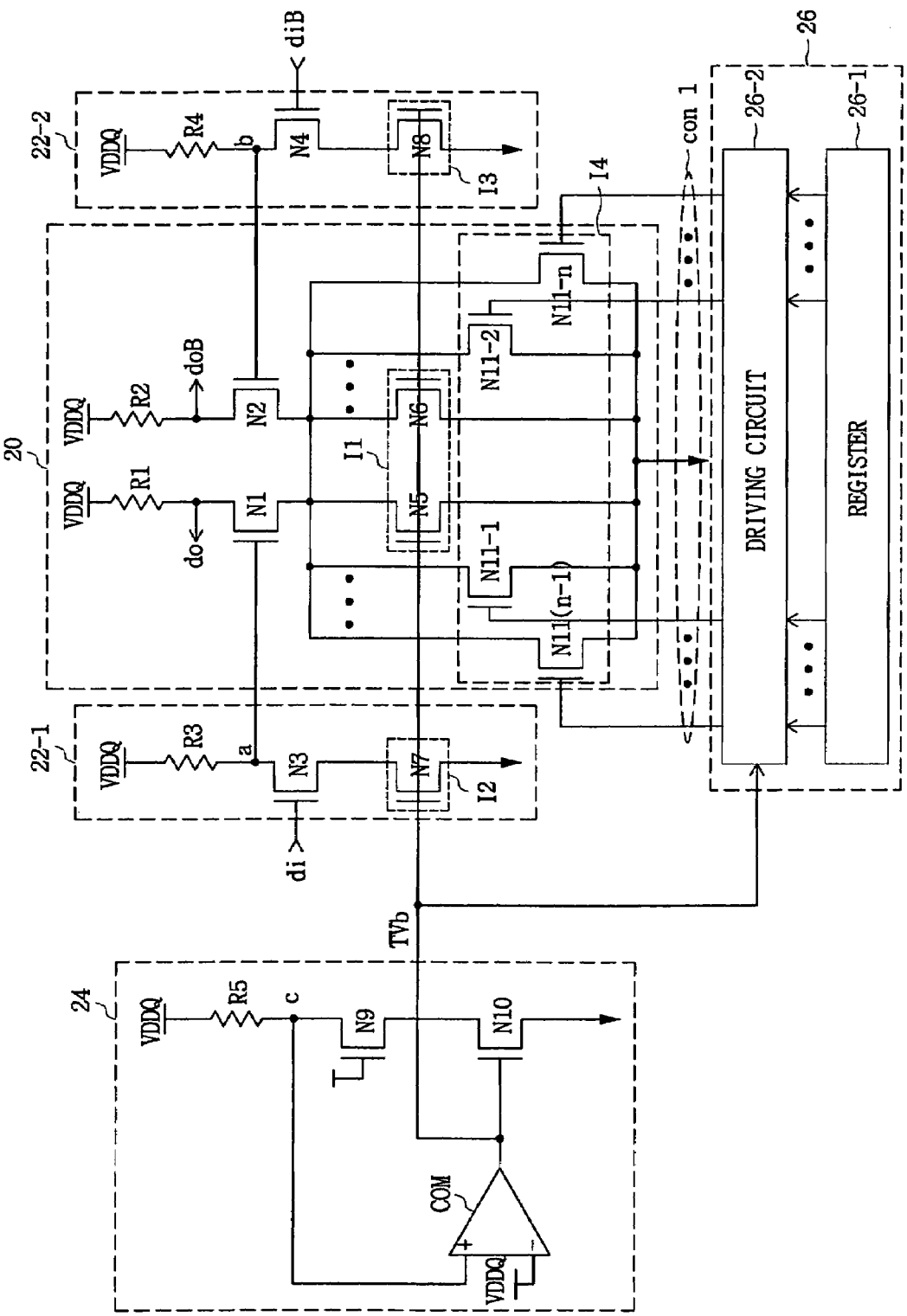
FIG. 4 is a detailed circuit diagram illustrating the data driving circuit of FIG. 3.

FIG. 4 is a detailed circuit diagram illustrating the data driving circuit of FIG. 3. The bias voltage generating circuit 24 includes a comparator COM, a resistor R5, and NMOS transistors N9 and N10. The current source I1 includes NMOS transistors N5 and N6. The current source I2 includes an NMOS transistor N7. The current source I3 includes an NMOS transistor N8. The current source I4 includes NMOS transistors N11-1 to N11-n. The output level control circuit 26 includes a register 26-1 and a driving circuit 26-2.

In FIG. 4, the NMOS transistors N11-1 to N11-n can be designed to be equal or unequal in channel width. Operation of the data driving circuit of FIG. 4 is explained below.

Figure 2:
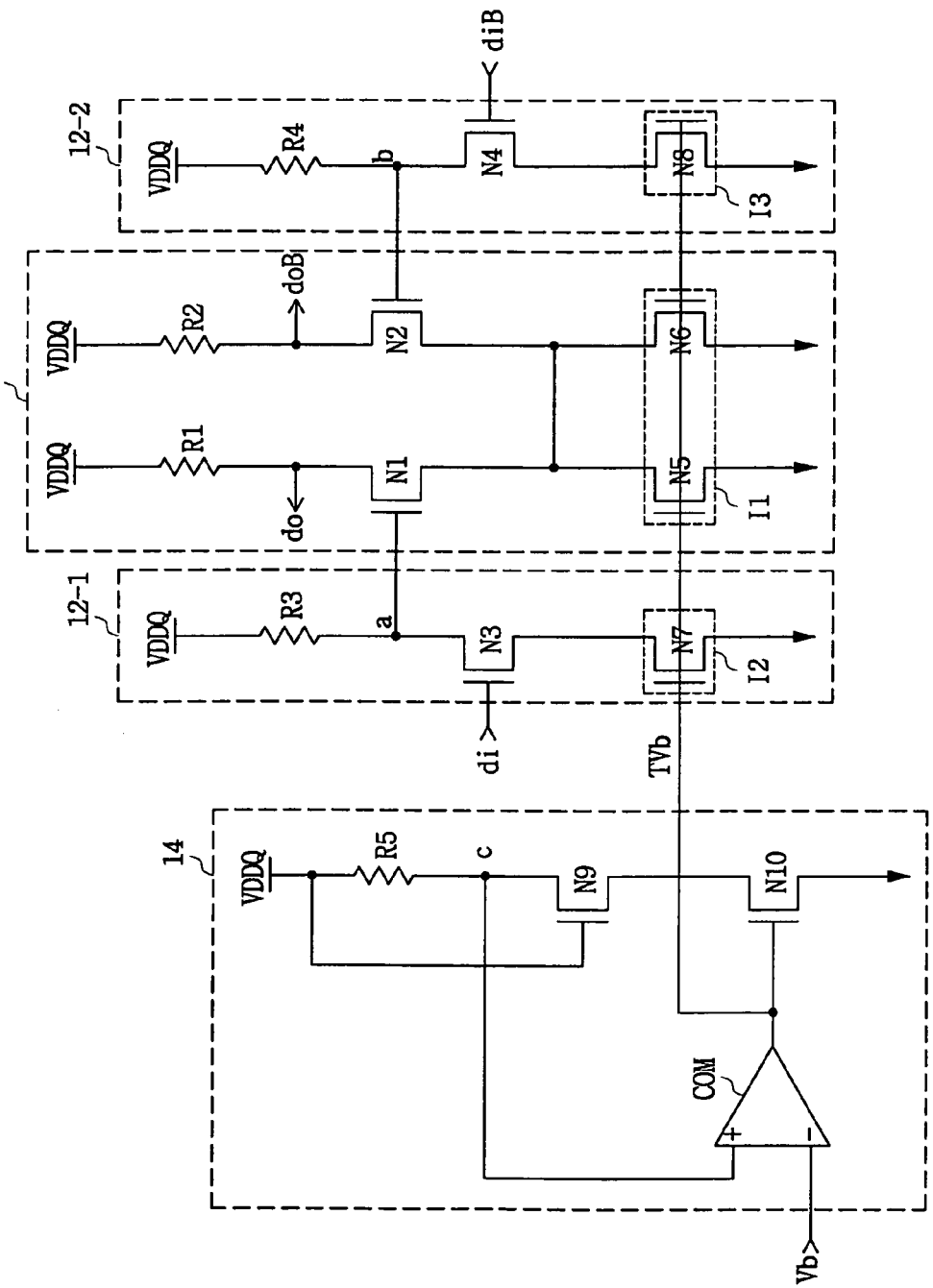
FIG. 2 is a detailed circuit diagram illustrating the data driving circuit of FIG. 1.

Like the bias voltage generating circuit of FIG. 2, the bias voltage generating circuit 24 generates a constant bias voltage TVb. Since not a bias voltage Vb but a power voltage VDDQ is used as a comparison voltage of the comparator COM, a more stable bias voltage TVb can be generated. Voltages Vb and VDDQ are typically different levels. The NMOS transistors N5 to N8 pass a current in response to a bias voltage TVb, respectively. The NMOS transistors N11-1 to N11-n pass a current in response to an n-bit digital control signal con1, respectively. The register 26-1 stores a digital signal. Here, the digital signal can be set by receiving a mode setting code during a mode setting operation or by programming using a well-known fuse program circuit. The driving circuit 26-2 receives a bias voltage TVb as a power voltage to generate a digital control signal having either a bias voltage TVb level or a ground voltage level in response to a digital signal outputted from the register 26-1. The NMOS transistors N11-1 to N11-n are turned on in response to a digital control signal having a bias voltage TVb level, respectively. Therefore, as the bit number of a digital control signal having a bias voltage TVb level is increased, the number of the NMOS transistors N11-1 to N11-n to be turned on is increased, thereby increasing a current of the current source I4. That is, as the bit number of a digital control signal having a bias voltage TVb level is increased, the effective channel widths of the NMOS transistors N11-1 to N11-n become wider, so that a current of the current source I4 is increased.

Operation of the pre-drivers 22-1 and 22-2 is the same as those of FIG. 2. That is, voltages of nodes a and b are the same as output voltages of the pre-drivers of FIG. 2. When node a is lower in voltage than node b, a current passing through the NMOS transistor N1 is smaller than a current passing through the NMOS transistor N2. However, when the current source I4 increases a current thereof, currents passing through the NMOS transistors N1 and N2 are almost equally increased. Therefore, the differential output data signals do and doB of "high" and "low" levels are shifted by an almost same level. Similarly, also when node a is higher in voltage than node b, the differential output data signals do and doB of "low" and "high" levels are shifted by an almost same level. That is, as a current of the current source I4 is increased, a level of the differential output data signals do and doB is shifted by the same level gradually.

Figure 5:
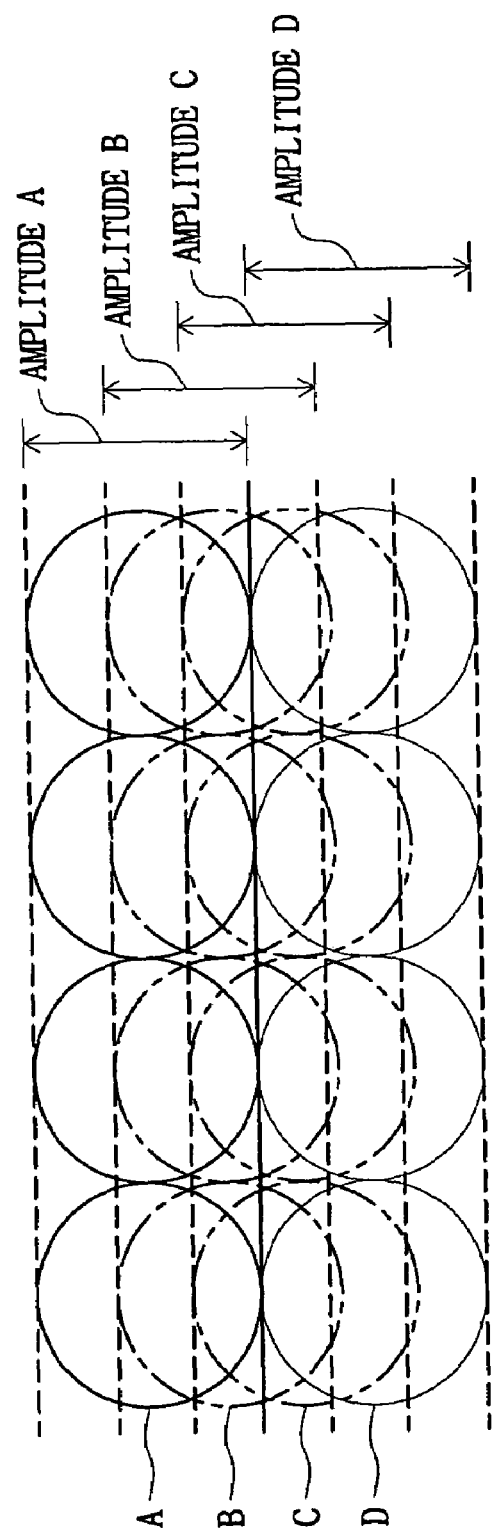
FIG. 5 is a wave diagram illustrating a wave of the differential output data signals outputted from the data driving circuit of FIG. 4.

FIG. 5 is a wave diagram illustrating a wave of the differential output data signals do and doB outputted from the data driving circuit of FIG. 4. As seen in FIG. 4, as a current of the current source I4 is increased, a level of the differential output data signals is shifted as shown as A, B, C and D. The differential output data signals of A, B, C, and D are equal in amplitude.

Therefore, the data driving circuit of the present invention varies channel widths of the NMOS transistors N11-1 to N11-n to increase a current of the current source I4 of the main driver 20 in response to a digital control signal con1, thereby controlling a level of the differential output data signals do and doB.

That is, the data driving circuit of the present invention controls a current of the current source not by increasing a level of a bias voltage applied to gates of the NMOS transistors by an analog method but by applying a digital control signal to gates of the NMOS transistors. Therefore, a margin in a saturation region of the NMOS transistors which constitute a current source is sufficiently secured, so that stable differential output data signals do and doB which are insensitive to a noise can be generated.

Figure 6:
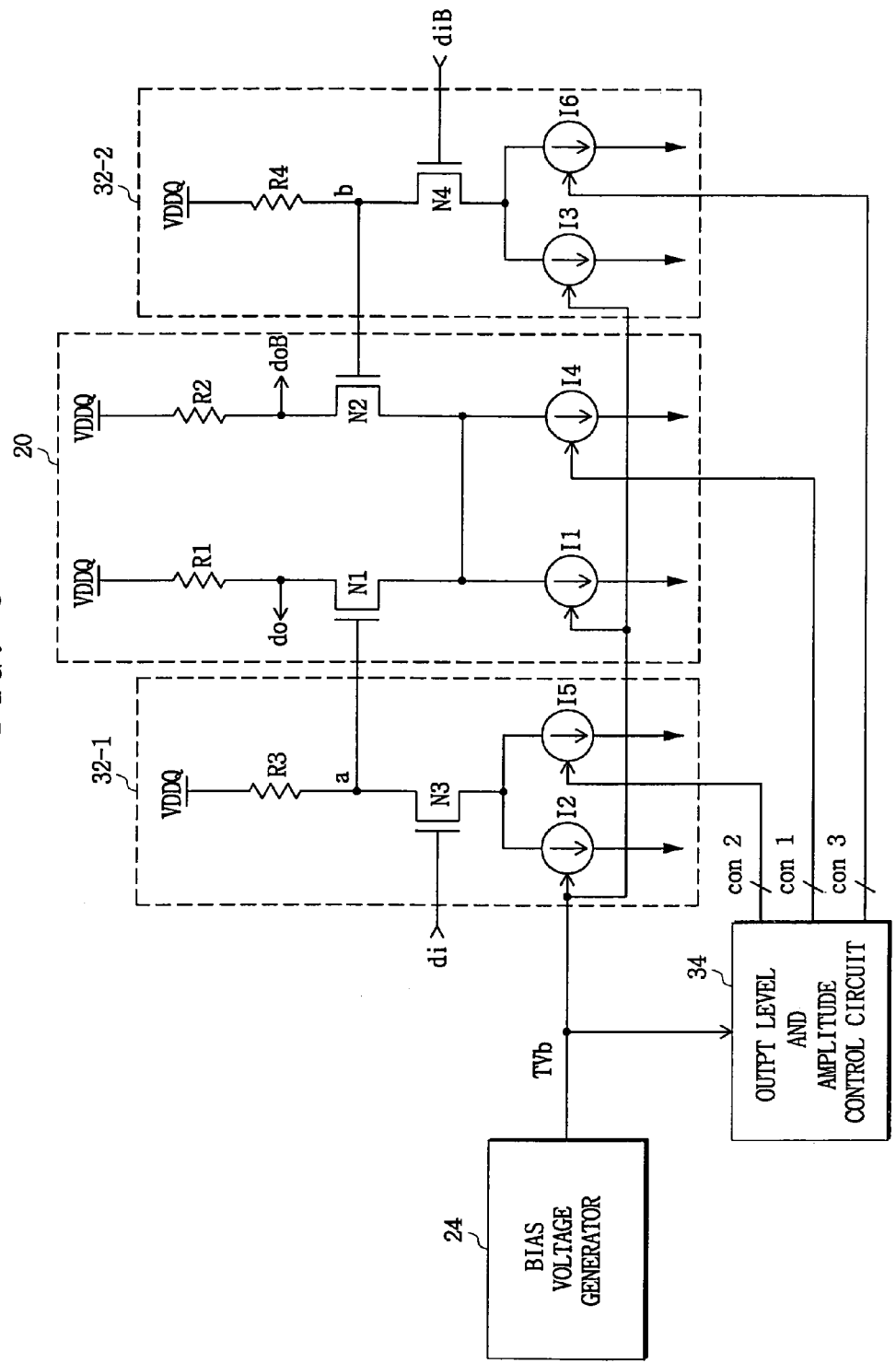
FIG. 6 is a circuit diagram illustrating a data driving circuit according to a second embodiment of the present invention.

FIG. 6 is a circuit diagram illustrating a data driving circuit according to a second embodiment of the present invention. In contrast to the pre-drivers 22-1 and 22-2 of FIG. 3, a current source I5 is added to the pre-driver 32-1, a current source I6 is added to the pre-driver 32-2, and the output level control circuit 26 of FIG. 3 is replaced with an output level and amplitude control circuit 34.

Operation of the data driving circuit of FIG. 6 is explained below. Here, like reference numerals of FIGS. 3 and 6 denote like parts and perform like operations, and therefore description of like parts is omitted.

The output level and amplitude control circuit 34 receives a bias voltage TVb as a power voltage to generate predetermined-bit digital control signals con1 to con3.

The current source I5 controls a current in response to a predetermined-bit digital control signal con2 outputted from the output level and amplitude control circuit 34. The current source I6 controls a current in response to a predetermined-bit digital control signal con3 outputted from the output level and amplitude control circuit 34.

That is, the data driving circuit of FIG. 6 controls not only a current of the current source I4 of the main driver 20 in response to a digital control signal con1 but also controls currents of the current sources I5 and I6 of the pre-drivers 32-1 and 32-2 in response to the digital control signals con2 and con3, respectively. Therefore, the differential output data signals do and doB are controlled in amplitude as well as level.

Figure 7:
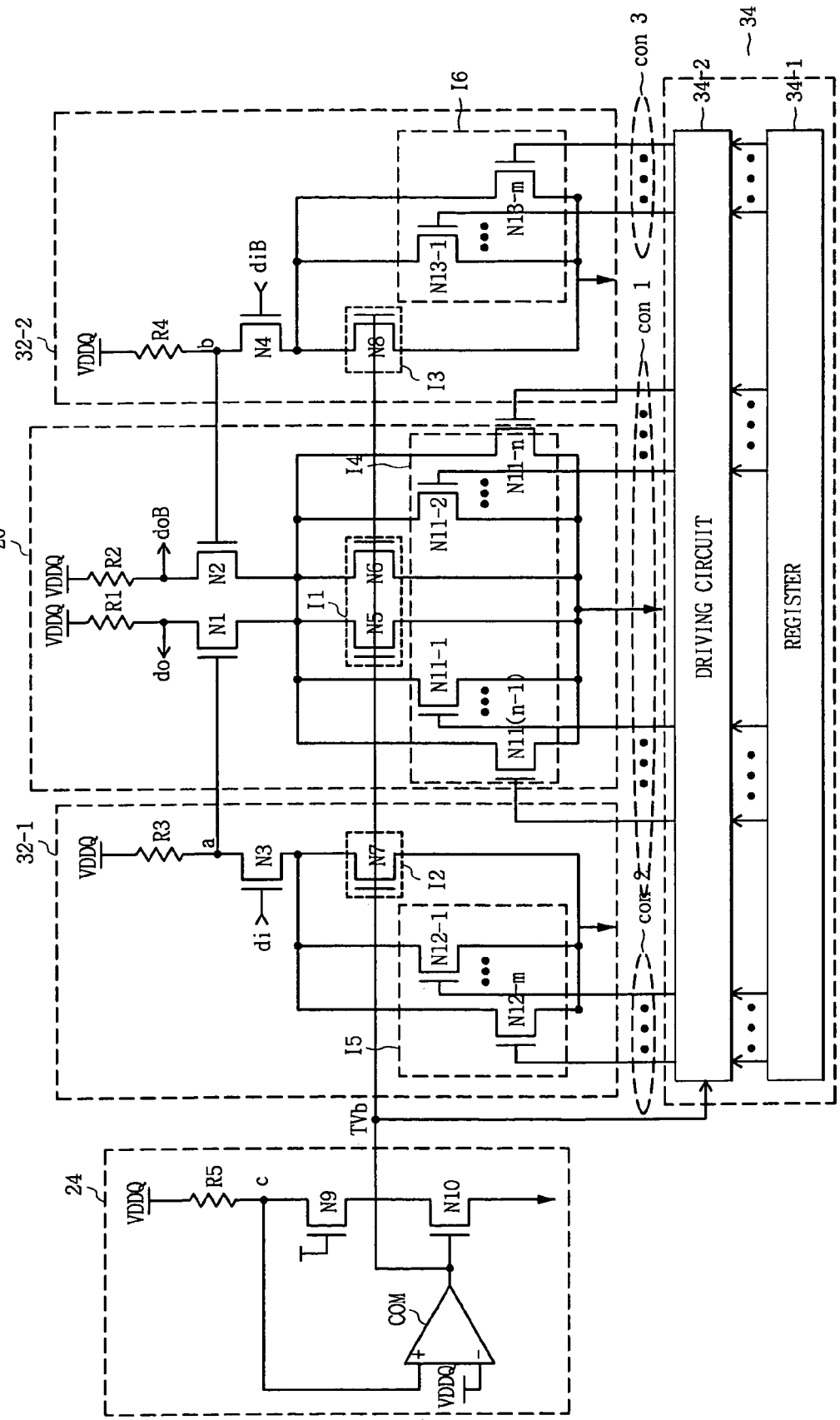
FIG. 7 is a detailed circuit diagram illustrating the data driving circuit of FIG. 6.

FIG. 7 is a detailed circuit diagram illustrating the data driving circuit of FIG. 6. The current source I5 includes NMOS transistors N12-1 to N12-m. The current source I6 includes NMOS transistors N13-1 to N13-m. The output level and amplitude control circuit 34 includes a register 34-1 and a driving circuit 34-2.

Operation of the data driving circuit of FIG. 7 is explained below.

The bias voltage generating circuit 24 operates in the same way as the bias voltage generating circuit of FIG. 4 to generate a constant bias voltage TVb. Each of the NMOS transistors N5 to N8 passes a current in response to a bias voltage TVb. Each of the NMOS transistors N11-1 to N11-n passes a current in response to an n-bit digital control signal con1. Each of the NMOS transistors N12-1 to N12-m passes a current in response to an m-bit digital control signal con2. Each of the NMOS transistors N13-1 to N13-m passes a current in response to an m-bit digital control signal con3. The register 34-1 stores a digital signal like the register 26-1 of FIG. 4. The driving circuit 34-2 generates a digital control signal having a bias voltage TVb level or digital control signals con1 to con3 having a ground voltage level in response to a digital control signal inputted from the register 34-1 like the driving circuit 26-2 of FIG. 4. Each of the NMOS transistors N11-1 to N11-n is turned on in response to a digital control signal con1 having a bias voltage TVb level, and each of the NMOS transistors N12-1 to N12-m is turned on in response to a digital control signal con2 having a bias voltage TVb level, and each of the NMOS transistors N13-1 to N13-m is turned on in response to a digital control signal con3 having a bias voltage TVb level. Therefore, as the bit number of each of the digital control signals con1 to con3 having a bias voltage TVb level is increased, the number of the NMOS transistors N11-1 to N11-n, N12-1 to N12-m, and N13-1 to N13-m to be turned on is increased, whereby a current of the current sources I7 to I9 is increased. That is, as the number of the digital control signal having a bias voltage TVb level is increased, channels of the NMOS transistors N11-1 to N11-n, N12-1 to N12-m, and N13-1 to N13-m becomes wider, whereby increasing a current of the current sources I4 to I6.

When a current of the current sources I4 to I6 is increased and the differential input data signals di and diB of "high" and "low" levels are inputted, like the data driving circuit of FIG. 2, the data driving circuit of the present invention operates. That is, when the differential output data signals do and doB of "high" and "low" levels are generated, a level of an output data do of "high" level remains almost same, but a level of an output data doB of "low" level is lowered.

The data driving circuit of the present invention controls a current of the current sources I4 to I6 of the main driver 20 and the pre-driver 32-1 and 32-2 by controlling channel width of the NMOS transistors N11-1 to N11-n, N12-1 to N12-m, and N13-1 to N13-m of each of the current sources I4 to I6 by the digital control signals con1 to con3. Therefore, a margin is secured in a saturation region of the NMOS transistors of the current sources I4 to I6, thereby lowering a noise and generating stable differential output data signals do and doB.

Figure 8:
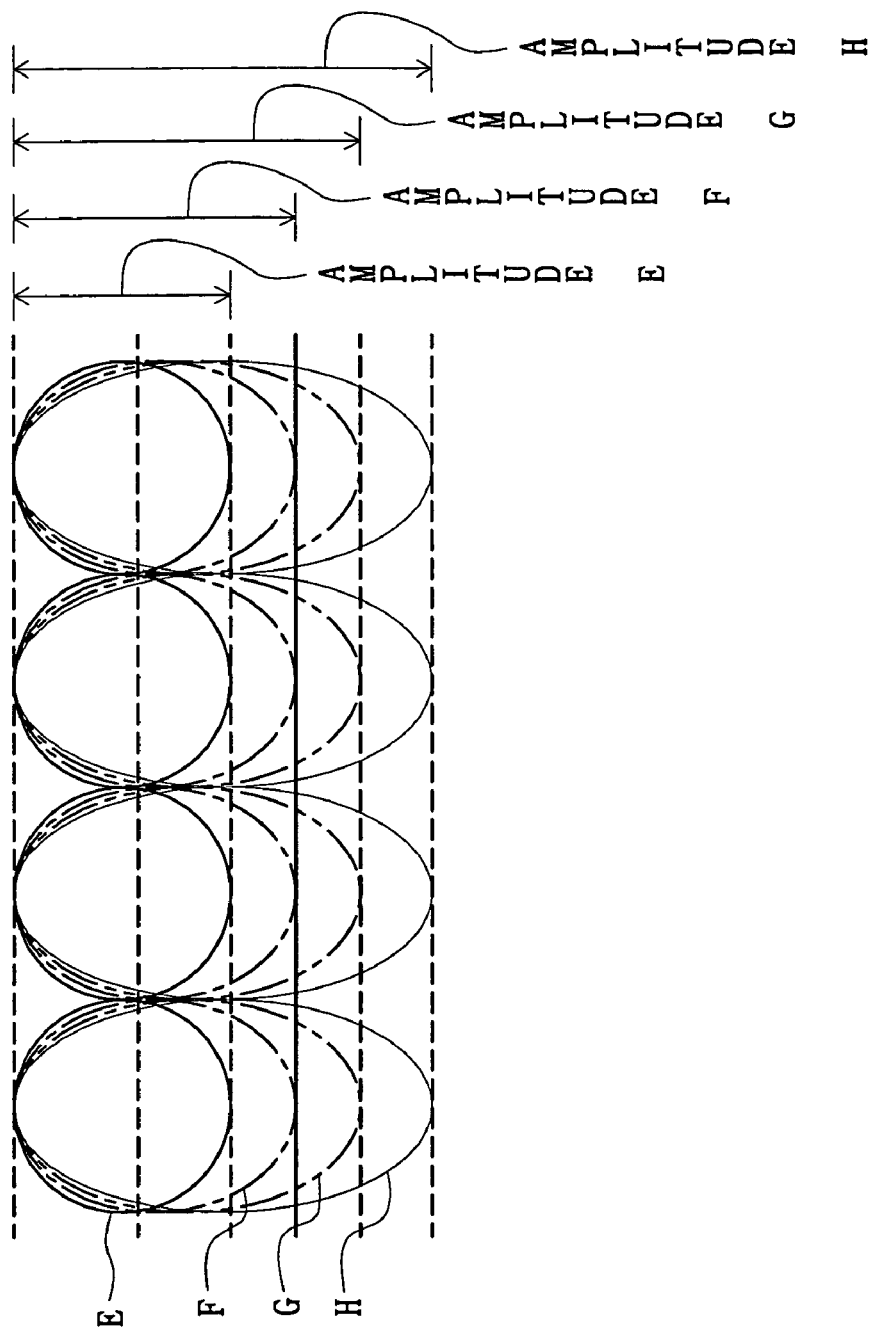
FIG. 8 is a wave diagram illustrating a wave of the differential output data signals outputted from the data driving circuit of FIG. 7.

FIG. 8 is a wave diagram illustrating a wave of the differential output data signals outputted from the data driving circuit of FIG. 7. As a current of the current sources I4 to I6 is increased, a level of the differential output data signals is varied. As seen by E, F, G, and H, a level of the differential output data signals of "low" level is lowered, and therefore an amplitude of the differential output data signals depicted as E, F, G, and H is increased.

Even though not shown, the data driving circuit of the present invention can be designed to gradually go down a level of the differential output data signals of "high" level by appropriately controlling a current of the main driver and the pre-driver.

Figure 9:
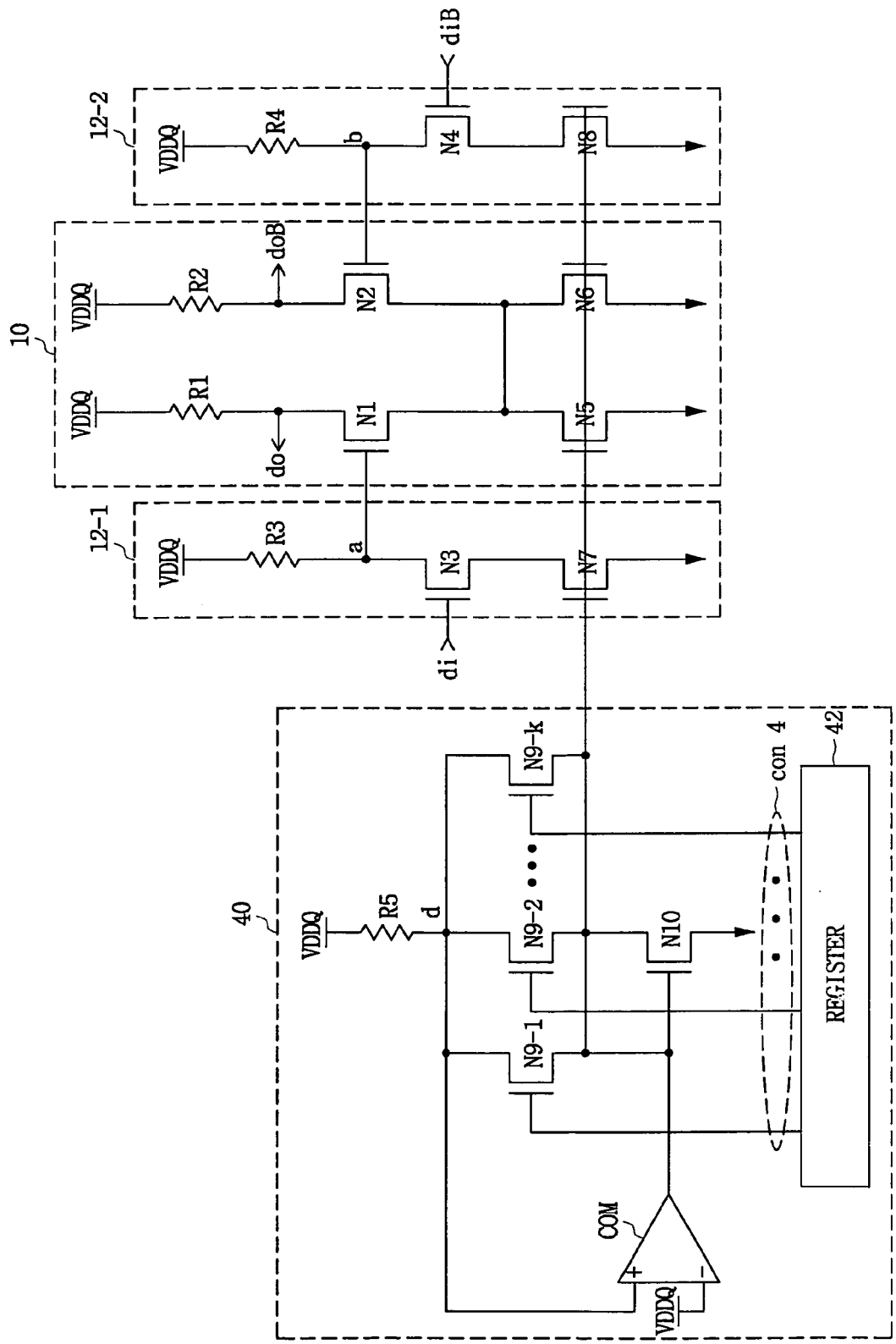
FIG. 9 is a circuit diagram illustrating a data driving circuit according to a third embodiment of the present invention.

FIG. 9 is a circuit diagram illustrating a data driving circuit according to a third embodiment of the present invention. The main driver 10 and the pre-drivers 12-1 and 12-2 have the same configuration as those of FIG. 2. A bias current generating circuit 40 includes a resistor R5, NMOS transistors N9-1 to N9-k and N10, a comparator COM, and a register 42.

Operation of the data driving circuit of FIG. 9 is explained below.

The register 42 generates a k-bit digital control signal con4 like the registers of FIG. 4 or FIG. 7. Each of the NMOS transistors N9-1 to N9-k is turned on in response to the k-bit digital control signal con4. When the bit number of the digital control signal con4 of "high" level outputted from the register 42 is increased, the NMOS transistors N9-1 to N9-k as many as the bit number of the digital control signal con4 of "high" level are turned on. Therefore, as the bit number of the digital control signal con4 of "high" level is increased, a current passing through the NMOS transistor N10 is increased. This leads to a increase of a current passing through the NMOS transistors N7 and N8. That is, the NMOS transistor N10 and the NMOS transistors N5 to N8 are configured as a current mirror circuit, so that the NMOS transistors N5 to N8 mirrors a current passing through the NMOS transistor N10. When the NMOS transistors N5 to N8 are designed to be n times as greater in size with as the NMOS transistor N10, a current which is n-times as much as a current passing through the NMOS transistor N10 passes through the NMOS transistors N5 to N8. Therefore, the data driving circuit of the present invention controls a current passing through the NMOS transistors N9-1 to N9-k by the digital control signal con4 outputted from the register 42 to thereby control a current passing through the NMOS transistors N5 to N8.

The data driving circuit of FIG. 9 controls all current passing through the NMOS transistors N5 to N8 of the main driver 10 and the pre-drivers 12-1 and 12-2 to vary an amplitude and level of the differential output data signals do and doB.

Even though not shown, the data driving circuit can be designed to apply an output signal of the bias current generating circuit 40 to gates of the NMOS transistors N5 and N6 and to apply a constant bias voltage TVb generated by the bias voltage generating circuit of FIG. 4 or FIG. 7 to the NMOS transistors N7 and N8. In this case, it is possible to shift a level of the differential output data signals do and doB.

As described herein before, the data driving circuit of the present invention not only can vary an amplitude and level but also can shift a level.

Also, the data driving circuit of the present invention varies a current of the current sources in response to a digital control signal so that a margin is secured in a saturation region of the NMOS transistors which constitute the current sources, whereby generating the differential output data which is insensitive to a noise.

Further, the data driving circuit described above can be applied to a data output terminal of a semiconductor device such as a semiconductor memory device to generate desired various levels of output data.

What is claimed is:

1. A semiconductor memory device including a data driving circuit, comprising:
    a driver in which a driving current is controlled in response to predetermined bits of digital control signal and which receives a differential input data signal to generate a differential output data signal; and
    a digital control signal generator for storing and generating the digital control signal,
    wherein the driver includes:
    a pre-driver for passing a pre driving current in response to a bias voltage and for receiving the differential input data signal to generate first and second signals; and
    a main driver in which a main driving current is controlled in response to the digital control signal and which generates the differential output data signal in response to the first and second signals.

2. The circuit of claim 1, wherein the pre-driver includes:
    a first pre driving circuit having a first load connected between a power voltage and a first node, a first switching transistor for being connected to the first node and for being switched in response to an input data signal of the differential input data signals, and a first pre driving current source connected between the first switching transistor and a ground voltage and passing the pre driving current in response to the bias voltage, wherein the first pre driving circuit generates the first signal through the first node; and
    a second pre driving circuit having a second load connected between the power voltage and the node, a second switching transistor for being connected to the second node and for being switched in response to an inverted input data signal of the differential input data signal, and a second pre driving current source connected between the second switching transistor and the ground voltage and passing the pre driving current in response to the bias voltage, wherein the second pre driving circuit generates the second signal through the second node.

3. The circuit of claim 1, wherein the main driver includes:
    a third load connected between the power voltage and a third node;
    a fourth load connected between the power voltage and a fourth node;
    a first transistor connected between the third node and a fifth node and having a gate receiving the first signal;
    a second transistor connected between the fourth node and the fifth node and having a gate receiving the second signal; and
    a main driving current source connected in parallel between the fifth node and the ground voltage and which a main driving current is controlled in response to the digital control signal,
    wherein an non-inverted data signal of the differential output data signals is generated through the third node and an inverted output data signal of the differential output data signals is generated through the fourth node.

4. The circuit of claim 3, wherein the main driving current source includes:
    a third transistor having a gate receiving the bias voltage; and
    a predetermined number of fourth transistors having gates receiving respective bit signals of the digital control signal and connected in parallel to the third transistor.

5. The circuit of claim 3, wherein the predetermined number of fourth transistors differ in channel width respectively.

6. The circuit of claim 1:
    in the pre-driver, the pre driving current is controlled in response to one part of predetermined bits of the digital control signal and receives the differential input data signals to generate the first and second signals; and
    in the main driver, the main driving current is controlled in response to another part of the predetermined bits of the digital control signal and generates the differential output data signal in response to the first and second signals.

7. The circuit of claim 6, wherein the pre-driver includes:
    a first pre driving circuit having a first load connected between a power voltage and a first node, a first switching transistor for being connected to the first node and for being switched in response to an input data signal of the differential input data signals, and a first pre driving current source which is connected between the first switching transistor and a ground voltage and which the pre driving current is controlled in response to part of bit of the digital control signal, wherein the first pre driving circuit generates the first signal through the first node; and a second pre driving circuit having a second load connected between the power voltage and a second node, a second switching transistor for being connected to the second node and for being switched in response to an inverted input data signal of the differential input data signals, and a second pre driving current source which is connected between the second switching transistor and the ground voltage and which the pre driving current is controlled in response to other part of bit of the digital control signal, wherein the second pre driving circuit generates the second signal through the second node.

8. The circuit of claim 7, wherein the first pre driving circuit includes:

a first transistor having a gate receiving the bias voltage; and a predetermined number of second transistors having gates receiving respective bit signals of one part of predetermined bits of the digital control signal and connected in parallel to the first transistor.

9. The circuit of claim 8, wherein the predetermined number of second transistors differ in channel width respectively.

10. The circuit of claim 7, wherein the second driving circuit includes:

a third transistor having a gate receiving the bias voltage; and a predetermined number of fourth transistors having gates receiving respective bit signals of part of bits of the digital control signal and connected in parallel to the third transistor.

11. The circuit of claim 10, wherein the predetermined number of fourth transistors differ in channel width respectively.

12. The circuit of claim 6, wherein the main driver includes:

a third load connected between the power voltage and a third node;

a fourth load connected between the power voltage and a fourth node;

a first transistor connected between the third node and a fifth node and having a gate receiving the first signal;

a second transistor connected between the fourth node and the fifth node and having a gate receiving the second signal; and a main driving current source connected in parallel between the fifth node and the ground voltage and controlling a main driving current in response to other bit of the predetermined bit of the second digital control signal, wherein an non-inverted data signal of the differential output data signals is generated through the third node and an inverted output data signal of the differential output data signals is generated through the fourth node.

13. The circuit of claim 12, wherein the main driving current source includes:

a fifth transistor having a gate receiving the bias voltage; and a predetermined number of sixth transistors having gates receiving respective bit signals of other bit of the digital control signal and connected in parallel to the fifth transistor.

14. The circuit of claim 13, wherein the predetermined number of sixth transistors differ in channel width respectively.

15. A data driving circuit, comprising:

a bias current generating circuit for generating a bias current in response to predetermined bits of digital control signal; and a driver for mirroring the bias current to generate a driving current and receiving a differential input data signal to generate differential output data signals;

wherein the driver includes:

a pre-driver for mirroring the bias current to pass a pre driving current and for receiving the differential input data signals to generate first and second signals; and a main driver for mirroring the bias current to pass a main driving current and receiving the first and second signals to generate the differential output data signals.

16. The circuit of claim 15, wherein the bias current generating circuit includes:

a digital control signal generating circuit for storing and generating the digital control signal;

a first load connected between a power voltage and a first node;

a predetermined number of first transistors connected between the first node and a second node, respectively having gates receiving the predetermined bit of digital control signal and generating the bias current;

a comparator comparing a voltage of the first node to a predetermined voltage to generate an output voltage to the second node; and a second transistor connected between the second node and a ground voltage, having a gate connected to the second node and passing the bias current.

17. A data driving circuit, comprising:

a bias current generating circuit for generating a bias current in response to predetermined bits of digital control signals; and a driver for mirroring the bias current to generate a driving current and receiving a differential input data signal to generate differential output data signals;

wherein the driver includes:

a pre-driver for passing a pre driving current in response to a bias voltage and for receiving the differential input data signals to generate first and second signals; and a main driver for mirroring the bias current to pass a main driving current and receiving the first and second signals to generate the differential output data signals.

18. The circuit of claim 17, wherein the bias current generating circuit includes:

a digital control signal generating circuit for storing and generating the digital control signal;

a first load connected between a power voltage and a first node;

a predetermined number of first transistors connected between the first node and a second node, respectively having gates receiving the predetermined bit of digital control signal and generating the bias current;

a comparator comparing a voltage of the first node to a predetermined voltage to generate an output voltage to the second node; and a second transistor connected between the second node and a ground voltage, having a gate connected to the second node and passing the bias current.

19. A semiconductor device having a plurality of data driving circuits, comprising:
  each of the plurality of the data driving circuit includes
  a driver in which a driving current is controlled in response to predetermined bits of digital control signal and which receives a differential input data signal to generate a differential output data signals; and
  a digital control signal generator for storing and generating the digital control signal;
  wherein the driver includes:
  a pre-driver for passing a pre driving current in response to a bias voltage and for receiving the differential input data signals to generate first and second signals; and
  a main driver in which a main driving current is controlled in response to the digital control signal and which generates the differential output data signals in response to the first and second signals.

20. A semiconductor device having a plurality of data driving circuits, comprising:
  each of the plurality of the data driving circuit includes
  a driver in which a driving current is controlled in response to predetermined bits of digital control signal and which receives a differential input data signal to generate a differential output data signals; and
  a digital control signal generator for storing and generating the digital control signal,
  wherein the driver includes:
  a pre-driver in which a pre driving current is controlled in response to one part of predetermined bits of the digital control signal and which receives the differential input data signals to generate first and second signals; and
  a main driver in which a main driving current is controlled in response to other part of predetermined bits of the digital control signal and which generates the differential output data signals in response to the first and second signals.

21. A semiconductor device having a plurality of data driving circuits, comprising:
  each of the plurality of the data driving circuit includes:
  a bias current generating circuit for generating a bias current in response to predetermined bits of digital control signal; and
  a driver for mirroring the bias current to generate a driving current and receiving a differential input data signal to generate differential output data signals,
  wherein the driver includes:
  a pre-driver for mirroring the bias current to pass a pre driving current and for receiving the differential input data signal to generate first and second signals; and
  a main driver for mirroring the bias current to pass a main driving current and receiving the first and second signals to generate the differential output data signals.

22. The circuit of claim 21, wherein the bias current generating circuit includes:
  a digital control signal generating circuit for storing and generating the digital control signal;
  a first load connected between a power voltage and a first node;
  a predetermined number of first transistors connected between the first node and a second node, respectively having gates receiving respective bit signals of the digital control signal and generating the bias current;
  a comparator comparing a voltage of the first node and a predetermined voltage to generate an output voltage to the second node; and
  a second transistor connected between the second node and a ground voltage, having a gate connected to the second node and passing the bias current.

23. A semiconductor device having a plurality of data driving circuit, comprising:
  each of the plurality of the data driving circuit includes:
  a bias current generating circuit for generating a bias current in response to predetermined bits of digital control signal; and
  a driver for mirroring the bias current to generate a driving current and receiving a differential input data signal to generate differential output data signal,
  wherein the driver includes:
  a pre-driver for mirroring the bias current to pass a pre driving current and for receiving the differential input data signal to generate first and second signals; and
  a main driver for mirroring the bias current to pass a main driving current and receiving the first and second signals to generate the differential output data signals.

24. The circuit of claim 23, wherein the bias current generating circuit includes;
  a digital control signal generating circuit for storing and generating the digital control signal;
  a first load connected between a power voltage and a first node;
  a predetermined number of first transistors connected between the first node and a second node, respectively having gates receiving respective bit signals of the digital control signal and generating the bias current;
  a comparator comparing a voltage of the first node and a predetermined voltage to generate an output voltage to the second node; and
  a second transistor connected between the second node and a round voltage, having a gate connected to the second node and passing the bias current.

* * * * *

UNITED STATES PATENT AND TRADEMARK OFFICE
CERTIFICATE OF CORRECTION

| | |
|---|---|
| PATENT NO. | : 7,088,152 B2 |
| APPLICATION NO. | : 10/848913 |
| DATED | : August 8, 2006 |
| INVENTOR(S) | : Jin-Hyun Kim |

Page 1 of 1

It is certified that error appears in the above-identified patent and that said Letters Patent is hereby corrected as shown below:

Column 14, line 49, the word "round" should read -- ground --.

Signed and Sealed this

Fourth Day of August, 2009

JOHN DOLL
*Acting Director of the United States Patent and Trademark Office*